US009541827B2

(12) United States Patent
Sakurai et al.

(10) Patent No.: US 9,541,827 B2
(45) Date of Patent: Jan. 10, 2017

(54) PHOTOSENSITIVE COMPOSITION, CURED FILM AND PRODUCTION PROCESS THEREOF, AND ELECTRONIC PART

(71) Applicant: JSR CORPORATION, Tokyo (JP)

(72) Inventors: Tomohiko Sakurai, Tokyo (JP); Masaaki Hanamura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 14/166,856

(22) Filed: Jan. 29, 2014

(65) Prior Publication Data

US 2014/0234777 A1   Aug. 21, 2014

(30) Foreign Application Priority Data

Feb. 21, 2013 (JP) .................. 2013-032085
Nov. 19, 2013 (JP) .................. 2013-238814

(51) Int. Cl.
| | | |
|---|---|---|
| *G03F 7/023* | (2006.01) | |
| *G03F 7/40* | (2006.01) | |
| *G03F 7/022* | (2006.01) | |
| *C09D 125/18* | (2006.01) | |
| *C08F 8/12* | (2006.01) | |
| *G03F 7/038* | (2006.01) | |

(52) U.S. Cl.
CPC ............... *G03F 7/0226* (2013.01); *C08F 8/12* (2013.01); *C09D 125/18* (2013.01); *G03F 7/0236* (2013.01); *G03F 7/0381* (2013.01); *G03F 7/0387* (2013.01); *G03F 7/40* (2013.01)

(58) Field of Classification Search
CPC .. G03F 7/0226; G03F 7/02333; G03F 7/0236; G03F 7/40
USPC .......................... 430/165, 191, 192, 193, 326
See application file for complete search history.

(56) References Cited

U.S. PATENT DOCUMENTS

| | | | |
|---|---|---|---|
| 7,214,454 B2 * | 5/2007 | Inomata et al. ................. 430/18 |
| 7,524,594 B2 * | 4/2009 | Amoroso et al. ............... 430/18 |
| 2004/0110084 A1 | 6/2004 | Inomata et al. | |
| 2008/0097032 A1 * | 4/2008 | Ito et al. ....................... 525/185 |
| 2008/0193880 A1 * | 8/2008 | Nishibe ..................... G03F 7/40 430/286.1 |
| 2010/0297542 A1 * | 11/2010 | Hayoz et al. ...................... 430/7 |
| 2011/0172349 A1 | 7/2011 | Ito et al. | |
| 2013/0168829 A1 | 7/2013 | Sasaki et al. | |

FOREIGN PATENT DOCUMENTS

| | | |
|---|---|---|
| JP | 5-281715 A | 10/1993 |
| JP | 06-180501 | 6/1994 |
| JP | 2000-298356 | 10/2000 |
| JP | 2002-139835 | 5/2002 |
| JP | 2004-240144 | 8/2004 |
| JP | 2006-178059 | 7/2006 |
| JP | 2007-056108 | 3/2007 |
| JP | 2007-140274 | 6/2007 |
| JP | 2007-192936 | 8/2007 |
| JP | 2008-260907 | 10/2008 |
| JP | 2009-237125 | 10/2009 |
| JP | 2009-237405 | 10/2009 |
| JP | 2010-015101 | 1/2010 |
| JP | 2010-102271 | 5/2010 |
| JP | 2012-123378 | 6/2012 |
| JP | 2012-226297 | 11/2012 |
| KR | 10-0325670 B1 | 2/2002 |
| KR | 2002-0022770 A | 3/2002 |
| KR | 10-2007-0007334 | 1/2007 |
| KR | 10-2007-0056062 | 5/2007 |
| KR | 10-2007-0073941 | 7/2007 |

OTHER PUBLICATIONS

Office Action issued Sep. 2, 2014 in Japanese Patent Application No. 2013-238814.
Combined Office Action and Search Report issued Apr. 23, 2015 in Taiwanese Patent Application No. 103100569 (with Japanese translation and English Translation of Category of Cited Documents).
Office Action issued Apr. 14, 2016 in Korean Patent Application No. 10-2013-0163538.
Office Action issued Oct. 25, 2016, in Korean Patent Application No. 10-2013-0163538 (w/ Machine-translated English translation).

* cited by examiner

*Primary Examiner* — John S Chu
(74) *Attorney, Agent, or Firm* — Oblon, McClelland, Maier & Neustadt, L.L.P.

(57) ABSTRACT

It is an object of the present invention to improve the curability of a resin composition and a photosensitive composition suitably employed to form e.g., a surface protecting film and an interlaminar insulating film of e.g., an electronic part, while reducing the internal stress remaining in a substrate when the composition is used to form a cured film on the substrate. The photosensitive composition includes a resin (A) having a phenolic hydroxyl group, a crosslinking agent (B1) having at least two oxazoline groups and a crosslinking agent (B2) having at least two groups represented by —CH$_2$OR (wherein R is a hydrogen atom, an alkyl group having 1 to 10 carbon atoms or an acetyl group) and a photosensitive acid-generating agent (C).

13 Claims, No Drawings

PHOTOSENSITIVE COMPOSITION, CURED FILM AND PRODUCTION PROCESS THEREOF, AND ELECTRONIC PART

TECHNICAL FIELD

The present invention relates to a resin composition and a photosensitive composition that are suitably used to form e.g., a surface protecting film and an interlaminar insulating film of e.g., an electronic part. The present invention also relates to a cured film formed from the composition and a production process thereof, and an electronic part including the cured film.

BACKGROUND ART

Conventionally, as a material used to form e.g., a surface protecting film and an interlaminar insulating film employed for a semiconductor device in an electronic part, various resin compositions or photosensitive compositions have been proposed (for example, see Patent Literatures 1 to 3).

Patent Literature 1 describes a photosensitive resin composition containing the following components in a solvent: a phenol resin (A) having a biphenyldiyl structure in the main chain, a photoacid-generating agent (B) and a compound (C) capable of reacting with the component (A) by an acid generated from the component (B) or by heat. This literature describes, as the component (C), hexamethoxymethylmelamine and tetramethoxymethylglycoluril.

Patent Literature 2 describes a positive photosensitive resin composition containing an alkali soluble resin (A) having a phenolic hydroxyl group, a compound (B) that generates an acid by light, a core/shell polymer (C), a solvent (D) and a heat crosslinking agent (E) that crosslinks the component (A) by heating. This literature describes, as the component (E), for example, hexamethoxymethylmelamine.

Patent Literature 3 describes a positive photosensitive resin composition containing a polycondensate, an oxazoline compound and a photosensitive diazoquinone compound, the polycondensate having a structure formed by the dehydration condensation of an aromatic diamine and a polyvalent carboxylic acid.

CITATION LIST

Patent Literatures

Patent Literature 1: JP-A-2012-123378
Patent Literature 2: JP-A-2009-237125
Patent Literature 3: JP-A-2007-192936

SUMMARY OF THE INVENTION

Technical Problem

Conventional resin compositions and photosensitive compositions employed to form e.g., surface protecting films and interlaminar insulating films, have a problem that as a result of incorporating only a crosslinking agent with excellent curability in order to give a cured film with improved chemical resistance, internal stress readily remain in a substrate having the cured film formed thereon. As such, it has been difficult for conventional art to improve the curability of the composition while reducing the internal stress remaining in the substrate having the cured film formed thereon.

It is an object of the present invention to improve the curability of a resin composition and a photosensitive composition suitably employed to form e.g., a surface protecting film and an interlaminar insulating film of e.g., an electronic part, while reducing the internal stress remaining in a substrate when the composition is used to form a cured film on the substrate.

Solution to Problem

The present inventors earnestly made their studies to solve the above problem, and have found that the use of components including e.g., a resin having a phenolic hydroxyl group in combination with specific crosslinking agents can solve the above problem, thereby completing the present invention.

That is, the present invention concerns, for example, the following [1] to [12].

[1] A photosensitive composition including a resin (A) having a phenolic hydroxyl group, a crosslinking agent (B1) having at least two oxazoline groups, a crosslinking agent (B2) having at least two groups represented by $-CH_2OR$ (wherein R is a hydrogen atom, an alkyl group having 1 to 10 carbon atoms or an acetyl group) and a photosensitive acid-generating agent (C).

[2] The photosensitive composition described in [1], wherein the content ratio of the crosslinking agent (B1) to the crosslinking agent (B2) (mass ratio, B1:B2) is in the range of 0.5:1 to 5:1.

[3] The photosensitive composition described in [1] or [2], wherein the total of the contents of the crosslinking agent (B1) and of the crosslinking agent (B2) is 50 to 100% by mass based on 100% by mass of the whole of a crosslinking agent (B) contained in the composition.

[4] The photosensitive composition described in any one of [1] to [3], wherein the crosslinking agent (B1) has two to three oxazoline groups.

[5] The photosensitive composition described in any one of [1] to [4], wherein the crosslinking agent (B2) includes at least one selected from melamine-based crosslinking agents, guanamine-based crosslinking agents, phenol compounds having methylol groups, phenol compounds having alkylmethylol groups and phenol compounds having acetoxymethyl groups.

[6] The photosensitive composition described in any one of [1] to [5], wherein the photosensitive acid-generating agent (C) includes a compound having a quinone diazide group.

[7] A resin composition including a resin (A) having a phenolic hydroxyl group, a crosslinking agent (B1) having at least two oxazoline groups and a crosslinking agent (B2) having at least two groups represented by $-CH_2OR$ (wherein R is a hydrogen atom, an alkyl group having 1 to 10 carbon atoms or an acetyl group).

[8] A cured film obtainable from the photosensitive composition described in any one of [1] to [6].

[9] A process for producing a patterned cured film including a step of applying the photosensitive composition described in any one of [1] to [6] on a support to form a resin coating film, a step of exposing the resin coating film, a step of developing the resin coating film by using an alkaline developing solution to form a pattern, and a step of heat-curing the pattern to form a patterned cured film.

[10] A cured film obtainable from the resin composition described in [7].

[11] A process for producing a cured film including a step of applying the resin composition described in [7] on a support to form a resin coating film, and a step of heat-curing the resin coating film to form a cured film.

[12] An electronic part including the cured film described in [8] or [10].

Advantageous Effects of the Invention

According to the present invention, the combined use of specific crosslinking agents can improve the curability of a resin composition and a photosensitive composition suitably employed to form e.g., a surface protecting film and an interlaminar insulating film of e.g., an electronic part, and simultaneously can reduce the internal stress remaining in a substrate when the composition is used to form a cured film on the substrate.

DESCRIPTION OF EMBODIMENTS

Hereinafter, embodiments for carrying out the present invention, including preferred embodiments, are described.

[Resin Composition]

The resin composition of the present invention includes a resin (A) having a phenolic hydroxyl group and a crosslinking agent (B) that are described later. When the resin composition of the present invention includes a photosensitive acid-generating agent (C), too, the composition is also referred to as the "photosensitive composition".

The resin composition of the present invention includes, as described later, as the crosslinking agent (B), a crosslinking agent (B1) having at least two oxazoline groups and a crosslinking agent (B2) having at least two groups represented by —$CH_2OR$ (wherein R is a hydrogen atom, an alkyl group having 1 to 10 carbon atoms or an acetyl group). The combined use of these crosslinking agents (B1) and (B2) can (i) improve the curability of the resin composition and the chemical resistance of the resultant cured film, and (ii) reduce the internal stress remaining in a substrate having a cured film formed thereon thereby suppressing the warpage of the substrate.

<Resin (A)>

The resin composition of the present invention includes a resin (A) having a phenolic hydroxyl group.

Examples of the resin (A) include novolak resins (a1), polymers (a2) having a structural unit derived from a radical-polymerizable monomer having a phenolic hydroxyl group, polyimides having a phenolic hydroxyl group, phenol xylylene glycol condensed resins, cresol xylylene glycol condensed resins, and phenol-dicyclopentadiene condensed resins. Of these, in terms of the curability of the composition and reducing the internal stress remaining in a substrate, the novolak resins (a1) and the polymers (a2) are preferable, and the polymers (a2) are more preferable.

The resins (A) may be used singly, or two or more kinds thereof may be used in combination.

<<Novolak Resin (a1)>>

The novolak resins (a1) are obtainable, for example, by condensing phenols and aldehydes in the presence of an acid catalyst. Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol. Examples of the aldehydes include formaldehyde, paraformaldehyde, acetaldehyde, benzaldehyde and salicylaldehyde.

Specific examples of the novolak resins (a1) include phenol/formaldehyde condensed novolak resin, cresol/formaldehyde condensed novolak resin, cresol/salicylaldehyde condensed novolak resin, phenol-naphthol/formaldehyde condensed novolak resin, and resins formed by modifying the novolak resins with a rubber polymer having a polymerizable vinyl group such as a butadiene-based polymer (for example, resins described in JP-A-2010-015101).

<<Polymer (a2)>>

Examples of the polymers (a2) include a homopolymer or copolymer of a radical-polymerizable monomer having a phenolic hydroxyl group, and a copolymer of a radical-polymerizable monomer having a phenolic hydroxyl group and other radical-polymerizable monomer.

Examples of the radical-polymerizable monomers having a phenolic hydroxyl group include hydroxystyrene-based monomers such as o-hydroxystyrene, m-hydroxystyrene, p-hydroxystyrene, o-isopropenylphenol, m-isopropenylphenol, and p-isopropenylphenol; monomers formed by replacing one, or two or more hydrogen atoms bonded to carbons of an aromatic ring of the hydroxystyrene-based monomers with an alkyl, an alkoxyl, a halogen, a haloalkyl, a nitro or a cyano; and vinylhydroquinone, 5-vinylpyrogallol and 6-vinylpyrogallol. Further examples are monomers formed by protecting a phenolic hydroxyl group of the monomers described above with e.g., an alkyl group or a silyl group. When the monomers formed by protecting the phenolic hydroxyl group are used, the formation of a polymer followed by the deprotecting of the polymer can provide the polymer (a2) having a phenolic hydroxyl group. The monomers may be used singly, or two or more kinds thereof may be used in combination.

Examples of the other radical-polymerizable monomers include styrene-based monomers such as styrene, α-methylstyrene, o-vinylbenzyl glycidyl ether, m-vinylbenzyl glycidyl ether, p-vinylbenzyl glycidyl ether; monomers formed by replacing one, or two or more hydrogen atoms bonded to carbons of an aromatic ring of the styrene-based monomers with an alkyl, an alkoxyl, a halogen, a haloalkyl, a nitro or a cyano; dienes such as butadiene, isoprene and chloroprene; unsaturated carboxylic acids such as unsaturated monocarboxylic acids, unsaturated dicarboxylic acids and half-esters thereof; o-vinylbenzoic acid, m-vinylbenzoic acid, p-vinylbenzoic acid, or monomers formed by replacing one, or two or more hydrogen atoms bonded to carbons of an aromatic ring of these monomers with an alkyl, an alkoxyl, a halogen, a haloalkyl, a nitro or a cyano; (meth)acrylic acid esters such as glycidyl (meth)acrylate, (meth)acrylonitrile, acrolein, vinyl chloride, vinylidene chloride, vinyl fluoride, vinylidene fluoride, N-vinylpyrrolidone, vinylpyridine, vinyl acetate, N-phenylmaleimide, N-cyclohexylmaleimide, N-(meth)acryloylphthalimide, and (3,4-epoxycyclohexyl)methyl(meth)acrylate. The monomers may be used singly, or two or more kinds thereof may be used in combination.

In the polymers of the radical-polymerizable monomers, the content of structural units derived from the radical-polymerizable monomers having a phenolic hydroxyl group is preferably 30 mol % or more, more preferably 40 to 95 mol % or more, based on 100 mol % of the total of the structural units derived from the radical-polymerizable monomers having a phenolic hydroxyl group and the structural units derived from the other radical-polymerizable monomers.

Preferable examples of the polymers of the radical-polymerizable monomers include hydroxystyrene-based polymers such as poly(p-hydroxystyrene), m-hydroxystyrene/p-hydroxystyrene copolymer, p-hydroxystyrene/styrene copolymer, p-hydroxystyrene/p-vinylbenzyl glycidyl ether/styrene copolymer, p-hydroxystyrene/(3,4-epoxy cyclohexyl)methylmethacrylate copolymer, and p-hydroxystyrene/(3,4-epoxy cyclohexyl)methylmethacrylate/styrene copolymer.

Other specific examples of the resin (A) are resins described in JP-A-2002-139835, JP-A-2004-240144, JP-A-2007-056108, JP-A-2010-102271, JP-A-2007-192936, JP-A-2009-237125 and JP-A-2012-123378. Details of how to produce the resin (A), too, are described in these literatures.

<<Configuration of Resin (A)>>

The resin (A) has a weight average molecular weight (Mw), as measured by gel permeation chromatography, in terms of polystyrene, of usually 1,000 to 200,000, preferably 2,000 to 100,000, more preferably 5,000 to 50,000, in view of the resolution of the photosensitive composition and the elastic modulus and crack resistance of the cured film. The detail of how to measure Mw is as described in Examples.

The resin (A) is preferably a resin that is dissolved in an amount of not less than 0.001 mg/ml in an aqueous tetramethylammoniumhydroxide solution (23° C.) having 2.38% by mass concentration.

The content of the resin (A) is usually 30 to 95% by mass, preferably 40 to 90% by mass, more preferably 50 to 90% by mass, based on 100% by mass of the total of all the components except the solvent (E) of the resin composition of the present invention. The content of the resin (A) in the above range tends to ensure the provision of a resin composition capable of forming a cured film excellent in resolution.

<Crosslinking Agent (B)>

The resin composition of the present invention includes, as the crosslinking agent (B), the crosslinking agent (B1) having at least two oxazoline groups and the crosslinking agent (B2) having at least two groups represented by —CH$_2$OR (wherein R is a hydrogen atom, an alkyl group having 1 to 10 carbon atoms or an acetyl group), as essential components. Hereinafter, the component (B1) is also referred to as the "oxazoline-based crosslinking agent (B1)" or simply as the "crosslinking agent (B1)", and the component (B2) is also referred to as the "crosslinking agent (B2) having an active methylene group" or simply as the "crosslinking agent (B2)".

The oxazoline-based crosslinking agent (B1) is considered to have slightly lower heat curability and be reacted with the phenolic hydroxyl group of the resin (A) at the time of heat-curing. On the other hand, the crosslinking agent (B2) having an active methylene group is considered to have higher heat curability and be reacted with an aromatic ring of the resin (A) at the time of heat-curing. As such, the oxazoline-based crosslinking agent (B1) and the crosslinking agent (B2) having an active methylene group are different from each other in terms of the portion of the component with which each of the crosslinking agents is reacted and also in terms of curability. This is considered to be the reason why the rapid crosslinking reaction, which causes internal stress, does not take place at the time of e.g., heat-curing, and crosslinking proceeds at a substantially constant rate from the start of crosslinking to the completion of crosslinking, so that beneficial effects of the present invention are exhibited.

The total of the contents of the crosslinking agent (B1) and of the crosslinking agent (B2) is preferably 50 to 100% by mass, more preferably 60 to 100% by mass, further preferably 70 to 100% by mass, based on 100% by mass of the whole of the crosslinking agent (B) contained in the composition. The total content of these components in the above range ensures excellent curability of the composition and reduction of the internal stress remaining in a substrate.

The content ratio of the crosslinking agent (B1) to the crosslinking agent (B2) (mass ratio, B1:B2) is preferably in the range of 0.5:1 to 5:1, more preferably in the range of 1:1 to 4:1, further preferably in the range of 1.5:1 to 3:1. The content ratio between these components in the above range ensures excellent curability of the composition and reduction of the internal stress remaining in a substrate.

In the resin composition of the present invention, the whole content of the crosslinking agent (B) is usually 1 to 60 parts by mass, preferably 5 to 50 parts by mass, more preferably 10 to 40 parts by mass, based on 100 parts by mass of the resin (A). The content of the crosslinking agent (B) in the above range tends to ensure the formation of a cured film excellent in resolution and storage stability, and achieve excellent curability of the composition and reduction of the internal stress remaining in a substrate.

<<Oxazoline-based Crosslinking Agent (B1)>>

The oxazoline-based crosslinking agent (B1) is a compound having at least two oxazoline groups, preferably a compound having two to six oxazoline groups, more preferably a bisoxazoline compound, which has two oxazoline groups, or a trisoxazoline compound, which has three oxazoline groups.

Examples of the bisoxazoline compound include compounds represented by the formula (31-1).

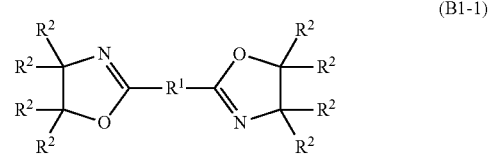

(B1-1)

$R^1$ is a single bond or a divalent organic group, with examples of the divalent organic group including an alkanediyl group, a cycloalkanediyl group, an arylene group, a group represented by —CH$_2$—O—CH$_2$—, a group represented by —C$_2$H$_4$—O-Ph-C(CH$_3$)$_2$-Ph-O—C$_2$H$_4$— (Ph is a phenylene group), and a pyridinediyl group. $R^2$s are each independently a hydrogen atom, an alkyl group, a cycloalkyl group, an aryl group, or an arylalkyl group.

The alkanediyl group usually has 1 to 10 carbon atoms. The cycloalkanediyl group usually has 3 to 12 carbon atoms. The arylene group usually has 6 to 20 carbon atoms. The alkyl group usually has 1 to 10 carbon atoms. The cycloalkyl group usually has 3 to 12 carbon atoms. The aryl group usually has 6 to 12 carbon atoms. The arylalkyl group usually has 7 to 12 carbon atoms.

Specific examples of the bisoxazoline compound include:
2,2'-bis(2-oxazoline),
2,2'-bis(4-methyl-2-oxazoline),
2,2'-bis(4-ethyl-2-oxazoline),
2,2'-bis(5-methyl-2-oxazoline),
2,2'-bis(5-ethyl-2-oxazoline),
2,2'-bis(4,4-dimethyl-2-oxazoline),
2,2'-bis(4,4-diethyl-2-oxazoline),
2,2'-bis(5,5-dimethyl-2-oxazoline),
2,2'-bis(5,5-diethyl-2-oxazoline),
2,2'-bis(4,4,5,5-tetramethyl-2-oxazoline),
2,2'-bis(4-propyl-2-oxazoline),
2,2'-bis(4-butyl-2-oxazoline),
2,2'-bis(4-hexyl-2-oxazoline),
2,2'-bis(4-cyclohexyl-2-oxazoline),
2,2'-bis(4-phenyl-2-oxazoline),
2,2'-bis(4-benzyl-2-oxazoline), 1,2-bis(2-oxazoline-2-yl)ethane,
1,3-bis(2-oxazoline-2-yl)propane,
1,4-bis(2-oxazoline-2-yl)butane,
1,6-bis(2-oxazoline-2-yl)hexane,
1,8-bis(2-oxazoline-2-yl)octane,
1,10-bis(2-oxazoline-2-yl)decane,
1,2-bis(4-methyl-2-oxazoline-2-yl)ethane,
1,2-bis(4,4-dimethyl-2-oxazoline-2-yl)ethane,
2,2-bis(4-tert-butyl-2-oxazoline)propane,
1,3-bis(4,4-dimethyl-2-oxazoline-2-yl)propane,
2,2-bis(4-phenyl-2-oxazoline)propane,
1,4-bis(4,4-dimethyl-2-oxazoline-2-yl)butane,
1,4-bis(2-oxazoline-2-yl)cyclohexane,
1,4-bis(4,4-dimethyl-2-oxazoline-2-yl)cyclohexane,
1,2-bis(2-oxazoline-2-yl)benzene,
1,3-bis(2-oxazoline-2-yl)benzene,
1,4-bis(2-oxazoline-2-yl)benzene,
1,2-bis(4-methyl-2-oxazoline-2-yl)benzene,
1,2-bis(5-methyl-2-oxazoline-2-yl)benzene,
1,3-bis(4-methyl-2-oxazoline-2-yl)benzene,
1,3-bis(5-methyl-2-oxazoline-2-yl)benzene,
1,4-bis(4-methyl-2-oxazoline-2-yl)benzene,
1,4-bis(5-methyl-2-oxazoline-2-yl)benzene,
1,3-bis(4,4-dimethyl-2-oxazoline-2-yl)benzene,
1,4-bis(4,4-dimethyl-2-oxazoline-2-yl)benzene,
1,4-bis(2-oxazoline-2-yl)naphthalene,
1,4-bis(4,4-dimethyl-2-oxazoline-2-yl)naphthalene,
2,2'-bis(2-oxazoline-2-yl)biphenyl,
2,6-bis(2-oxazoline-2-yl)pyridine,
2,6-bis(4-isopropyl-2-oxazoline-2-yl)pyridine,
2,6-bis(4-phenyl-2-oxazoline-2-yl)pyridine,
2,6-bis(4,4-dimethyl-2-oxazoline-2-yl)pyridine,
2,2'-9,9'-diphenoxyethanebis(2-oxazoline), and
compounds represented by the following formulae.

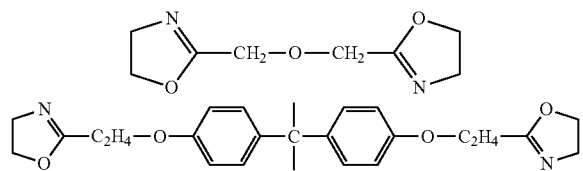

Specific examples of the trisoxazoline compound include 1,2,4-tris(2-oxazoline-2-yl)benzene.

Specific examples of the polyoxazoline compound having four or more oxazoline groups include oxazoline ring-having polymers such as poly(2-vinyl-2-oxazoline), poly(2-isopropenyl-2-oxazoline), 2-vinyl-2-oxazoline/styrene copolymer, and 2-vinyl-2-oxazoline/methyl (meth)acrylate copolymer.

The crosslinking agents (B1) may be used singly, or two or more kinds thereof may be used in combination.

<<Crosslinking Agent (B2) Having an Active Methylene Group>>

The crosslinking agent (B2) having an active methylene group is a crosslinking agent having at least two groups represented by —$CH_2OR$. Here, since the group represented by —$CH_2OR$ has an active methylene group, the active methylene group is nucleophilically reacted with an aromatic ring of the resin (A) by heat, an acid or a base, so that crosslinking reaction proceeds. Here, the "active methylene group" means a methylene group sandwiched between two electron donor groups. In the formula, R is a hydrogen atom, an alkyl group having 1 to 10 carbon atoms or an acetyl group, preferably a hydrogen atom or an alkyl group having 1 to 6 carbon atoms.

Examples of the crosslinking agent (B2) include compounds having at least two groups represented by the formula (b2-1), compounds having at least two groups represented by the formula (b2-2), phenol compounds having methylol groups, phenol compounds having alkylmethylol groups, and phenol compounds having acetoxymethyl groups.

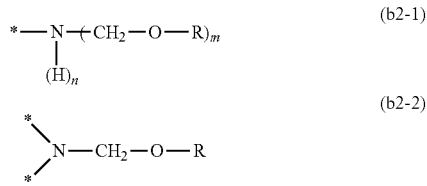

In the formulae (b2-1) and (b2-2), m is 1 or 2; n is 0 or 1; m+n is 2; R is a hydrogen atom, an alkyl group having 1 to 10 carbon atoms or an acetyl group, preferably a hydrogen atom or an alkyl group having 1 to 6 carbon atoms; and * is a bond.

Examples of the crosslinking agent (B2) include nitrogen compounds such as polymethylolated melamine, polymethylolated glycoluril, polymethylolated guanamine and polymethylolated urea; and compounds in which the whole or part of the active methylol group ($CH_2OH$ group bonded to N atom) in the nitrogen compounds is alkyl-etherificated or acetoxylated. Here, the alkyl groups for alkyl-etherification include methyl group, ethyl group, propyl group and butyl group, and may be the same as or different from one another. The active methylol groups without alkyl-etherification or acetoxylation may be self-condensed in one molecule, or may be condensed between two molecules to form an oligomer component.

Examples of the crosslinking agent (B2) are crosslinking agents described in JP-A-H06-180501, JP-A-2006-178059 and JP-A-2012-226297. Specific examples thereof include melamine-based crosslinking agents such as polymethylolated melamine, hexamethoxymethylmelamine, hexaethoxymethylmelamine, hexapropoxymethylmelamine, and hexabutoxymethylmelamine; glycoluril-based crosslinking agents such as polymethylolated glycoluril, tetramethoxymethyl glycoluril, and tetrabutoxymethyl glycoluril; and guanamine-based crosslinking agents including compounds formed by methylolating guanamines such as 3,9-bis[2-(3,5-diamino-2,4,6-triazaphenyl)ethyl]2,4,8,10-tetraoxospiro[5.5]undecane, and 3,9-bis[2-(3,5-diamino-2,4,6-triazaphenyl)propyl]2,4,8,10-tetraoxospiro[5.5]undecane, and compounds in which the whole or part of the active methylol group in these compounds is alkyl-etherificated or acetoxylated. Of these, the melamine-based crosslinking agents and guanamine-based crosslinking agents are preferable.

Examples of the phenol compounds having methylol groups, the phenol compounds having alkylmethylol groups and the phenol compounds having acetoxymethyl groups include a compound represented by the following formula, 2,6-dimethoxymethyl-4-t-butylphenol, 2,6-dimethoxymethyl-p-cresol, and 2,6-diacetoxymethyl-p-cresol.

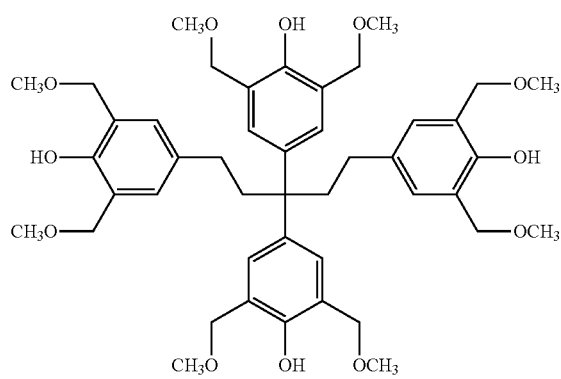

The crosslinking agents (B2) may be used singly, or two or more kinds thereof may be used in combination.

<<Other Crosslinking Agent (B3)>>

The resin composition of the present invention may include, as the crosslinking agent (B), other crosslinking agent (B3) in addition to the crosslinking agents (B1) and (B2). Examples of the other crosslinking agent (B3) include oxylane ring-containing compounds, oxetane ring-containing compounds, isocyanate group-containing compounds (including blocked ones), and aldehyde group-containing phenol compounds. However, from the oxylane ring-containing compounds, silane coupling agents having an epoxy group described later are excluded, and from the isocyanate group-containing compounds, silane coupling agents having an isocyanate group described later are excluded.

The oxirane ring-containing compounds are not limited as long as containing an oxirane ring (also called an oxiranyl group) in the molecule. Example thereof include phenol novolak epoxy resins, cresol novolak epoxy resins, bisphenol epoxy resins, trisphenol epoxy resins, tetraphenol epoxy resins, phenol-xylylene epoxy resins, naphthol-xylylene epoxy resins, phenol-naphthol epoxy resins, phenol-dicyclopentadiene epoxy resins, alicyclic epoxy resins and aliphatic epoxy resins.

Specific examples of the oxylane ring-containing compounds include resorcinol diglycidyl ether, pentaerythritol glycidyl ether, trimethylolpropane polyglycidyl ether, glycerol polyglycidyl ether, phenyl glycidyl ether, neopentyl glycol diglycidyl ether, ethylene/polyethylene glycol diglycidyl ether, propylene/polypropylene glycol diglycidyl ether, 1,6-hexanediol diglycidyl ether, sorbitol polyglycidyl ether, propylene glycol diglycidyl ether, and trimethylolpropane triglycidyl ether.

The oxetane ring-containing compounds are not limited as long as containing an oxetane ring (also called an oxetanyl group) in the molecule. Examples thereof include compounds represented by any of the formulae (b3-1) to (b3-3).

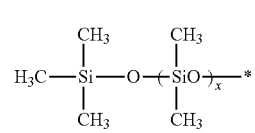 (b3-1)

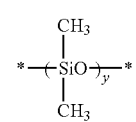 (b3-2)

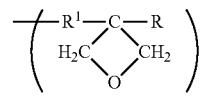 (b3-3)

In the formulas (b3-1) to (b3-3), A is a direct bond, or an alkanediyl group such as a methylene group, an ethylene group and a propylene group; R is an alkyl group such as a methyl group, an ethyl group and a propyl group; $R^1$ is an alkanediyl group such as a methylene group, an ethylene group and a propylene group; $R^2$ is an alkyl group such as a methyl group, an ethyl group, a propyl group and a hexyl group, an aryl group such as a phenyl group and a xylyl group, a group represented by the following formula (wherein R and $R^1$ are synonymous with R and $R^1$ in the formulae (b3-1) to (b3-3), respectively),

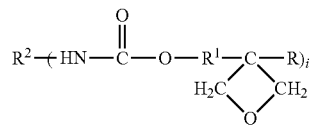

a dimethylsiloxane residue represented by the formula (i), an alkanediyl group such as a methylene group, an ethylene group and a propylene group, a phenylene group, or a group represented by any of the formulae (ii) to (vi); and i is equal to the valence of $R^2$ and is an integer of 1 to 4. In the formulae (i) to (vi), "*" shows a bonding position.

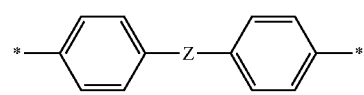 (i)

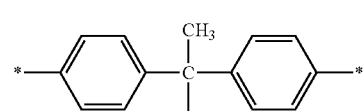 (ii)

(iii)

(iv)

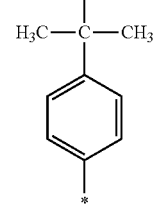

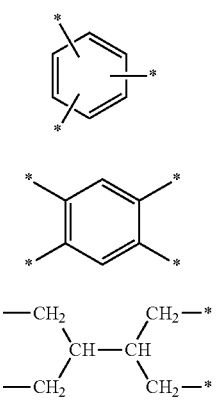

(v)

(v)'

(vi)

In the formulae (i) and (ii), x and y are each independently an integer of 0 to 50. In the formula (iii), Z is a direct bond, or a divalent group represented by —O—, —CH$_2$—, —C(CH$_3$)$_2$—, —C(CF$_3$)$_2$—, —CO— or —SO$_2$—.

Specific examples of the compounds represented by any of the formulae (b3-1) to (b3-3) include 1,4-bis{[(3-ethyl-oxetane-3-yl)methoxy]methyl}benzene (product name "OXT-121", manufactured by TOAGOSEI, CO., Ltd.), 3-ethyl-3-{[(3-ethyloxetane-3-yl)methoxy]methyl}oxetane (product name "OXT-221", manufactured by TOAGOSEI, CO., Ltd.), 4,4'-bis[(3-ethyl-3-oxetanyl)methoxymethyl]biphenyl (product name "ETERNACOLL OXBP" manufactured by UBE Industries, Ltd.), bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoropropane, tri[(3-ethyl-3-oxetanylmethoxy)methyl]benzene, tetra[(3-ethyl-3-oxetanylmethoxy)methyl]benzene, and compounds represented by any of the formulae (b3-a) to (b3-d).

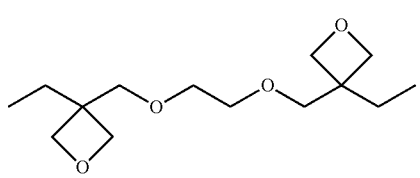

(b3-a)

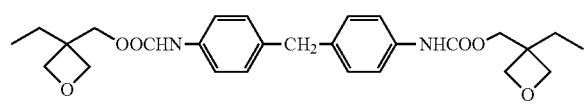

(b3-b)

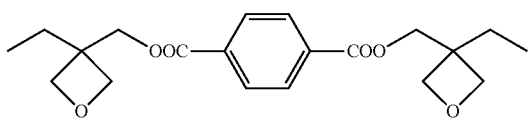

(b3-c)

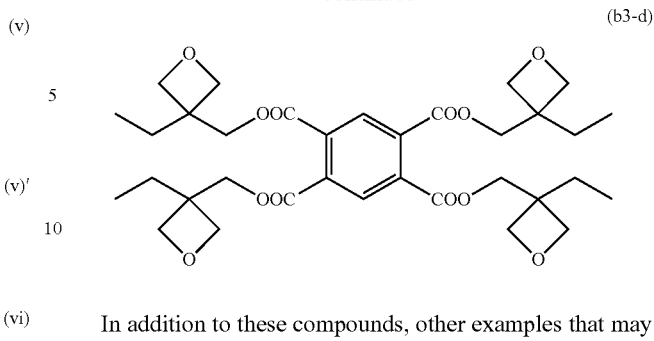

(b3-d)

In addition to these compounds, other examples that may be used are high-molecular weight compounds having a polyvalent oxetane ring. Examples thereof include oxetane oligomer (product name "Oligo-OXT", manufactured by TOAGOSEI CO., Ltd.), and compounds represented by any of the formulae (b3-e) to (b3-g).

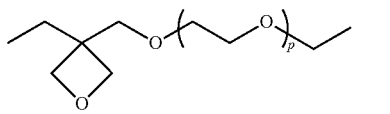

(b3-e)

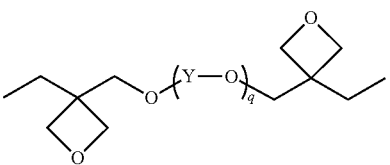

(b3-f)

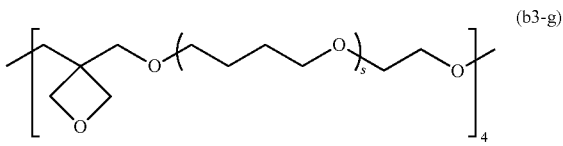

(b3-g)

In the formulae (b3-e) to (b3-g), p, q and s are each independently an integer of 0 to 10000, preferably an integer of 1 to 10. In the formula (b3-f), Y is an alkanediyl group such as an ethylene group and a propylene group, or a group represented by —CH$_2$-Ph-CH$_2$— (wherein Ph is a phenylene group).

The crosslinking agents (B3) may be used singly, or two or more kinds thereof may be used in combination.

<Photosensitive Acid-generating Agent (C)>

The photosensitive composition of the present invention includes the photosensitive acid-generating agent (C). The photosensitive acid-generating agent (C) is a compound that generates an acid by light irradiation. As a result of exposure treatment performed for a resin coating film formed from the photosensitive composition of the present invention, an acid attributed to the photosensitive acid-generating agent (C) is generated at the exposed part, and by the action of the acid, the solubility of the exposed part in an aqueous alkali solution is changed.

The photosensitive composition of the present invention may be a positive photosensitive composition or may be a negative photosensitive composition. The type of the photosensitive acid-generating agent (C) is appropriately selectable depending on the positive photosensitive composition or the negative photosensitive composition.

Examples of the photosensitive acid-generating agent (C) include compounds having a quinone diazide group, onium salt compounds, halogen-containing compounds, sulfone compounds, sulfonic acid compounds, sulfonimide compounds, and diazomethane compounds. Hereinafter, the compound having a quinone diazide group is also referred to as the "quinone diazide compound (C1)", and the other photosensitive acid-generating agents than the examples mentioned above are also referred to as the "other acid-generating agent (C2)".

The quinone diazide compound (C1) is a compound in which the quinone diazide group is decomposed by light irradiation to generate a carboxyl group. The photosensitive composition including the quinone diazide compound (C1) gives a coating film that is hardly dissolved in an alkaline developing solution. By utilizing the property that the film when irradiated with light changes its state from being at an alkali hardly-soluble state to being at an alkali easily-soluble state, a positive pattern can be formed.

The other acid-generating agent (C2) is a compound to form an acid by light irradiation. The photosensitive composition including the other acid-generating agent (C2) gives a coating film having a crosslinked structure formed as a result of the action of the acid generated by light irradiation on the components such as the resin (A) and the crosslinking agent (B), and this film is hardly dissolved in an alkali. By utilizing the property that the film when irradiated with light changes its state from being at an alkali easily-soluble state to being at an alkali hardly-soluble state, a negative pattern can be formed.

<<Quinone Diazide Compound (C1)>>

Examples of the quinone diazide compound (C1) include naphthoquinone diazide compounds. Specific examples include ester compounds formed between a compound having at least one phenolic hydroxyl group and 1,2-naphthoquinone diazide-4-sulfonic acid or 1,2-naphthoquinone diazide-5-sulfonic acid.

Examples of the compounds having at least one phenolic hydroxyl group include compounds represented by any of the following formulae (C1-1) to (C1-5). These compounds may be used singly or two or more kinds may be used in combination.

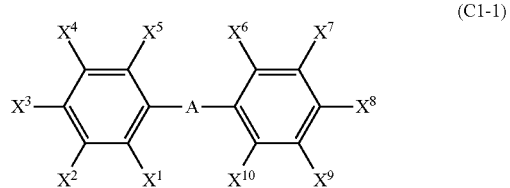
(C1-1)

In the formula (C1-1), $X^1$ to $X^{10}$ are each independently a hydrogen atom, an alkyl group having 1 to 4 carbon atoms, an alkoxy group having 1 to 4 carbon atoms or a hydroxyl group; at least one of $X^1$ to $X^5$ is a hydroxyl group; and A is a direct bond, —O—, —S—, —CH$_2$—, —C(CH$_3$)$_2$—, —C(CF$_3$)$_2$—, a carbonyl group (—C(=O)—) or a sulfonyl group (—S(=O)$_2$—).

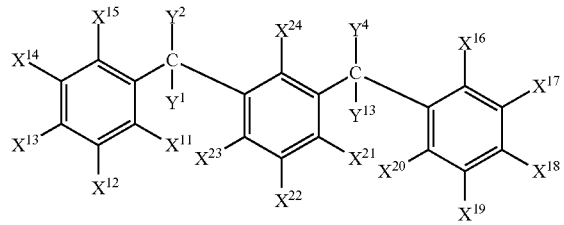
(C1-2)

In the formula (C1-2), $X^{11}$ to $X^{24}$ are each independently a hydrogen atom, an alkyl group having 1 to 4 carbon atoms, an alkoxy group having 1 to 4 carbon atoms or a hydroxyl group; at least one of $X^{11}$ to $X^{15}$ is a hydroxyl group; and $Y^1$ to $Y^4$ are each independently a hydrogen atom or an alkyl group having 1 to 4 carbon atoms.

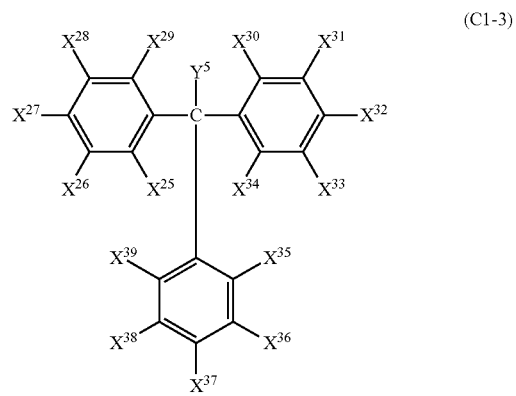
(C1-3)

In the formula (C1-3), $X^{25}$ to $X^{39}$ are each independently a hydrogen atom, an alkyl group having 1 to 4 carbon atoms, an alkoxy group having 1 to 4 carbon atoms or a hydroxyl group; at least one of $X^{25}$ to $X^{29}$ is a hydroxyl group; at least one of $X^{30}$ to $X^{34}$ is a hydroxyl group; and $Y^5$ is a hydrogen atom or an alkyl group having 1 to 4 carbon atoms.

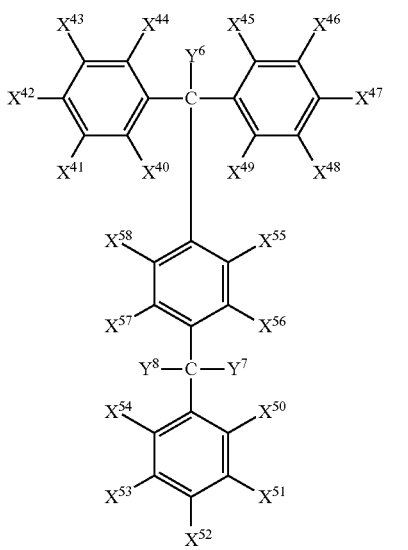
(C1-4)

In the formula (C1-4), $X^{40}$ to $X^{58}$ are each independently a hydrogen atom, an alkyl group having 1 to 4 carbon atoms, an alkoxy group having 1 to 4 carbon atoms or a hydroxyl group; at least one of $X^{40}$ to $X^{44}$ is a hydroxyl group; at least one of $X^{45}$ to $X^{49}$ is a hydroxyl group; at least one of $X^{50}$ to $X^{54}$ is a hydroxyl group; and $Y^6$ to $Y^8$ are each independently a hydrogen atom or an alkyl group having 1 to 4 carbon atoms.

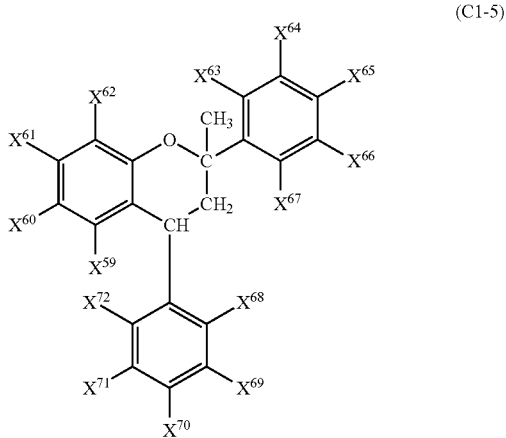

(C1-5)

In the formula (C1-5), $X^{59}$ to $X^{72}$ are each independently a hydrogen atom, an alkyl group having 1 to 4 carbon atoms, an alkoxy group having 1 to 4 carbon atoms or a hydroxyl group; at least one of $X^{59}$ to $X^{62}$ is a hydroxyl group; and at least one of $X^{63}$ to $X^{67}$ is a hydroxyl group.

Examples of the quinone diazide compound (C1) include ester compounds formed between a compound selected from
4,4'-dihydroxydiphenylmethane,
4,4'-dihydroxydiphenyl ether,
2,3,4-trihydroxybenzophenone,
2,3,4,4'-tetrahydroxybenzophenone,
2,3,4,2',4'-pentahydroxybenzophenone,
tris(4-hydroxyphenyl)methane,
tris(4-hydroxyphenyl)ethane,
1,1-bis(4-hydroxyphenyl)-1-phenylethane,
1,3-bis[1-(4-hydroxyphenyl)-1-methylethyl]benzene,
1,4-bis[1-(4-hydroxyphenyl)-1-methylethyl]benzene,
4,6-bis[1-(4-hydroxyphenyl)-1-methylethyl]-1,3-dihydroxybenzene and
1,1-bis(4-hydroxyphenyl)-1-[4-[1-(4-hydroxyphenyl)-1-methylethyl]phenyl]ethane, and
1,2-naphthoquinone diazide-4-sulfonic acid or
1,2-naphthoquinone diazide-5-sulfonic acid.

The quinone diazide compounds (C1) may be used singly or two or more kinds may be used in combination.

In the photosensitive composition of the present invention, when the quinone diazide compound (C1) is used as the photosensitive acid-generating agent (C), the content of the quinone diazide compound (C1) is preferably 5 to 50 parts by mass, more preferably 10 to 30 parts by mass, still more preferably 15 to 30 parts by mass, based on 100 parts by mass of the resin (A). When the content of the quinone diazide compound (C1) is not less than the above-mentioned lower limit, the film remaining percentage of an unexposed part is improved and a film is easily patterned with fidelity to a mask pattern. When the content of the quinone diazide compound (C1) is not more than the above-mentioned upper limit, a cured film excellent in pattern shape is easily obtained and foaming at the time of film formation tends to be prevented.

<<Other Acid-generating Agent (C2)>>

Examples of the other acid-generating agent (C2) include at least one selected from onium salt compounds, halogen-containing compounds, sulfone compounds, sulfonic acid compounds, sulfonimide compounds and diazomethane compounds.

Examples of the onium salt compounds include iodonium salts, sulfonium salts, phosphonium salts, diazonium salts and pyridinium salts. Specific examples of onium salts that are preferred include diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate, triphenylsulfonium trifluoromethanesulfonate, triphenylsulfonium p-toluenesulfonate, triphenylsulfonium hexafluoroantimonate, 4-t-butylphenyl.diphenylsulfonium trifluoromethanesulfonate, 4-t-butylphenyl.diphenylsulfonium p-toluenesulfonate, 4,7-di-n-butoxynaphthyltetrahydrothiophenium trifluoromethanesulfonate, 4-(phenylthio)phenyldiphenylsulfoniumtris(pentafluoroethyl)trifluorophosphate, and 4-(phenylthio)phenyldiphenylsulfoniumhexafluorophosphate.

Examples of the halogen-containing compounds include haloalkyl group-containing hydrocarbon compounds and haloalkyl group-containing heterocyclic compounds. Specific examples of halogen-containing compounds that are preferred include 1,10-dibromo-n-decane, 1,1-bis(4-chlorophenyl)-2,2,2-trichloroethane; and s-triazine derivatives such as phenyl-bis(trichloromethyl)-s-triazine, 4-methoxyphenyl-bis(trichloromethyl)-s-triazine, styryl-bis(trichloromethyl)-s-triazine, naphthyl-bis(trichloromethyl)-s-triazine, and 2-[2-(5-methylfuran-2-yl)ethenyl]-4,6-bis(trichloromethyl)-1,3,5-triazine.

Examples of the sulfone compounds include β-ketosulfone compounds, β-sulfonylsulfone compounds and α-diazo compounds of these compounds. Specific examples of sulfone compounds that are preferred include 4-trisphenacylsulfone, mesitylphenacylsulfone and bis(phenacylsulfonyl)methane.

Examples of the sulfonic acid compounds include alkylsulfonic acid esters, haloalkylsulfonic acid esters, arylsulfonic acid esters and iminosulfonates. Specific examples of sulfonic acid compounds that are preferred include benzointosylate, pyrogallol tristrifluoromethanesulfonate, o-nitrobenzyl trifluoromethanesulfonate and o-nitrobenzyl p-toluenesulfonate.

Examples of the sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hepto-5-en-2,3-dicarboxyimide and N-(trifluoromethylsulfonyloxy)naphthylimide.

Examples of the diazomethane compounds include bis(trifluoromethylsulfonyl)diazomethane, bis(cyclohexylsulfonyl)diazomethane and bis(phenylsulfonyl)diazomethane.

The other acid-generating agents (C2) may be used singly or two or more kinds may be used in combination.

In the photosensitive composition of the present invention, when the other acid-generating agents (C2) is used as the photosensitive acid-generating agent (C), the content of the acid-generating agent (C2) is preferably 0.1 to 10 parts by mass, more preferably 0.3 to 5 parts by mass, still more preferably 0.5 to 5 parts by mass, based on 100 parts by mass of the resin (A). When the content of the acid-generating agent (C2) is not less than the above-mentioned lower limit, curing at an exposed part is sufficient and heat resistance is easily improved. When the content of the acid-generating agent (C2) is not more than the above-mentioned upper limit, a pattern having high resolution is easily obtained without decrease in the transparency with respect to exposure light.

<Adhesion Assistant (D)>

The resin composition of the present invention, in order to improve the adhesion between a cured film and a substrate, may further include an adhesion assistant (D). The adhesion assistant (D) is preferably a functional silane coupling agent. Examples thereof include silane coupling agents having a reactive substituent such as a carboxyl group, a methacryloyl group, a vinyl group, an isocyanate group and an epoxy group. Specific examples thereof include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, β-(3,4-epoxycyclohexyl)ethyltrimethoxysilane and 1,3,5-N-tris(trimethoxysilylpropyl)isocyanurate.

In the resin composition of the present invention, when the adhesion assistant (D) is used, the content of the adhesion assistant (D) is preferably 0.5 to 30 parts by mass, more preferably 0.5 to 20 parts by mass, based on 100 parts by mass of the resin (A). The content of the adhesion assistant (D) in the above range ensures improved adhesion of the cured film to a substrate.

<Solvent (E)>

The resin composition of the present invention preferably further includes a solvent (E). The use of the solvent (E) can improve the handling properties as well as control the viscosity and the storage stability of the resin composition.

Examples of the solvent (E) include:

ethylene glycol monoalkyl ether acetates such as ethylene glycol monomethyl ether acetate and ethylene glycol monoethyl ether acetate;

propylene glycol monoalkyl ethers such as propylene glycol monomethyl ether, propylene glycol monoethyl ether, propylene glycol monopropyl ether and propylene glycol monobutyl ether;

propylene glycol dialkyl ethers such as propylene glycol dimethyl ether, propylene glycol diethyl ether, propylene glycol dipropyl ether and propylene glycol dibutyl ether;

propylene glycol monoalkyl ether acetates such as propylene glycol monomethyl ether acetate, propylene glycol monoethyl ether acetate, propylene glycol monopropyl ether acetate and propylene glycol monobutyl ether acetate;

cellosolves such as ethyl cellosolve and butyl cellosolve;

carbitols such as butyl carbitol;

lactic acid esters such as methyl lactate, ethyl lactate, n-propyl lactate and isopropyl lactate;

aliphatic carboxylic acid esters such as ethyl acetate, n-propyl acetate, isopropyl acetate, n-butyl acetate, isobutyl acetate, n-amyl acetate, isoamyl acetate, isopropyl propionate, n-butyl propionate and isobutyl propionate;

other esters such as methyl 3-methoxypropionate, ethyl 3-methoxypropionate, methyl 3-ethoxypropionate, ethyl 3-ethoxypropionate, methyl pyruvate and ethyl pyruvate;

ketones such as 2-heptanone, 3-heptanone, 4-heptanone and cyclohexanone;

amides such as N-dimethylformamide, N-methylacetamide, N,N-dimethylacetamide and N-methylpyrrolidone;

lactones such as γ-butyrolactone; and aromatic hydrocarbons such as toluene and xylene.

Of these, lactic acid esters, propylene glycol monoalkyl ether acetates, propylene glycol monoalkyl ethers are preferable; and ethyl lactate, propylene glycol monomethyl ether acetate, propylene glycol monomethyl ether are more preferable.

The solvents (E) may be used singly or two or more kinds may be used in combination.

In the resin composition of the present invention, when the solvent (E) is used, the content of the solvent (E) is usually 40 to 900 parts by mass, preferably 60 to 400 parts by mass, based on 100 parts by mass of the total of all the components of the composition except the solvent (E).

<Other Additives>

The resin composition of the present invention may further include various additives such as crosslinked fine particles, leveling agents, surfactants, sensitizers, inorganic fillers and quenchers in a range which is not detrimental to the object and properties of the present invention.

<Preparation Method of Resin Composition>

The resin composition of the present invention can be prepared by uniformly mixing the individual components. A mixture obtained after uniformly mixing the individual components may be filtered by using a filter in order to remove contaminants.

[Cured Film]

The cured film of the present invention is formed, for example, from the above-mentioned resin composition or photosensitive composition. By using the above composition, a cured film having high chemical resistance and crack resistance can be produced. By using the above photosensitive composition, a patterned cured film having high resolution can be produced. Furthermore, internal stress remaining in a substrate having the cured film formed thereon can be reduced.

Thus, the resin composition of the present invention can be used suitably for formation materials for e.g., surface-protecting films, interlaminar insulating films and flattening films of electronic parts such as circuit substrates (semiconductor devices), semiconductor packages and display devices, and for insulating film materials for high-density mounting substrates.

A production example of the cured film of the present invention is described below. This production example 1 includes a step of applying the resin composition of the present invention on a support to form a resin coating film (coating step), and a step of heat-curing the resin coating film to form a cured film (curing step).

In the cured film of the present invention, a production example of a patterned cured film is described below. This production example 2 includes a step of applying the photosensitive composition of the present invention on a support to form a resin coating film (coating step); a step of exposing the resin coating film via a desired mask pattern (exposure step); a step of developing the resin coating film by using an alkaline developing solution to dissolve and remove an exposed part (in the case of a positive photosensitive composition) or an unexposed part (in the case of a negative photosensitive composition) thereby forming the desired pattern on the support (development step); and a step of heat-curing the pattern to form a patterned cured film (curing step).

[1] Coating Step

In the coating step in the production examples 1 and 2, the composition is applied on a support so that a finally-obtainable cured film has a thickness of e.g., 0.1 to 100 μm, and is heated with an oven or a hot plate usually at a temperature of 50 to 140° C. for 10 to 360 seconds. Thereby, the resin coating film is formed on the support.

Examples of the support include a silicon wafer, a compound semiconductor wafer, a metal thin film-having wafer, a glass substrate, a quartz substrate, a ceramic substrate, an aluminum substrate and a substrate having a semiconductor chip on a surface of any of these supports. Examples of the coating method include dipping, spraying, bar coating, roll coating, spin coating, curtain coating, gravure printing, silk screening and ink jet method.

[2] Exposure Step

In the exposure step in the production example 2, the resin coating film is subjected via a desired mask pattern to exposure, for example, using a contact aligner, a stepper or a scanner. Examples of the exposure light include ultraviolet light and visible light. Usually, a light with a wavelength of 200 to 500 nm (e.g., i-ray (365 nm)) is used. The activated light irradiation quantity varies depending on type and incorporation amount of the individual components in the photosensitive composition, the thickness of the resin coating film and the like, but the exposure quantity is usually 100 to 1500 mJ/cm$^2$ when i-ray is used as the exposure light.

When the negative photosensitive composition is used, the exposure may be followed by heat treatment. Hereinafter, this treatment is also referred to as "PEB treatment". PEB conditions, varying depending on contents of the individual components in the photosensitive composition, the film thickness and the like, are such that the treatment temperature is usually 70 to 150° C., preferably 80 to 120° C., and the treatment time is about 1 to 60 minutes.

[3] Development Step

In the development step in the production example 2, the resin coating film is developed by using an alkaline developing solution to dissolve and remove an exposed part (in the case of a positive photosensitive composition) or an unexposed part (in the case of a negative photosensitive composition) thereby forming a desired pattern on the support. Examples of the development method include shower development, spray development, immersion development and puddle development. The development conditions are such that the development temperature is about 20 to 40° C. and the development time is about 1 to 10 minutes.

Examples of the alkaline developing solution include an alkaline aqueous solution obtained by dissolving, in water, an alkaline compound such as sodium hydroxide, potassium hydroxide, ammonia water, tetramethylammonium hydroxide and choline in order for the solution to have a concentration of 1 to 10% by mass. Into the above alkaline aqueous solution, for example, a water-soluble organic solvent such as methanol and ethanol, a surfactant and the like may be added in an appropriate amount. After developed by using an alkaline developing solution, the resin coating film may be washed with water and dried.

[4] Curing Step

In the production examples 1 and 2, for example, in order to fully exhibit properties of insulating films, the resin coating film or pattern is cured by heating. Curing conditions are not particularly limited, but according to uses of the cured film, the film is heated, for example, at a temperature of 100 to 250° C. for about 30 minutes to 10 hours. In order for curing to sufficiently proceed or in order to prevent the deformation of the pattern shape, heating may be carried out through multi-stages.

In such a manner as described above, the cured film can be obtained.

[Electronic Part]

The use of the resin composition of the present invention can produce an electronic part including the cured film described above: for example, an electronic part such as a circuit substrate (semiconductor device), a semiconductor package or a display device which has at least one cured film selected from a surface-protecting film, an interlaminar insulating film and a flattening film.

EXAMPLES

Hereinafter, the present invention is described in greater detail with reference to Examples, but the present invention is in no way limited by these Examples. In the following section including Examples, "part(s)" is used to mean "part(s) by mass" unless otherwise noted.

1. Measurement Method of Properties

Measurement Method of Weight Average Molecular Weight (Mw) of Resin (A)

Under conditions described below, Mw was measured by gel permeation chromatography.

Column: TSK-M and TSK2500, each of which is a column manufactured by Tosoh Corporation, were connected in series.
Solvent: tetrahydrofuran
Temperature: 40° C.
Detection method: refractive index method
Standard substance: polystyrene
GPC apparatus: "HLC-8220-GPC" (apparatus name), manufactured by Tosoh Corporation Measurement Method of Content of Structural Unit of Resin (A)

The content of the structural unit was measured by $^2$H-NMR and $^{13}$C-NMR analysis.

2. Synthesis of Resin (A)

Synthesis Example 1

Synthesis of Copolymer (A1)

70 parts of p-t-butoxystyrene and 10 parts of styrene were dissolved in 150 parts of propylene glycol monomethyl ether. Under a nitrogen atmosphere, the reaction temperature was kept at 70° C., and by using 4 parts of azobisisobutyronitrile, polymerization was conducted for 10 hours. Thereafter, to the reaction solution, sulfuric acid was added, and the reaction was allowed to proceed for 10 hours with the reaction temperature kept at 90° C. Then, p-t-butoxystyrene was deprotected to be converted to p-hydroxystyrene. To the resultant copolymer, ethyl acetate was added. The mixture was washed with water five times to collect the ethyl acetate layer and remove the solvent. A p-hydroxystyrene/styrene copolymer (A1) was thus obtained.

The copolymer (A1) had a weight average molecular weight (Mw) of 10,000. The copolymer (A1) was a copolymer containing 80 mol % of a p-hydroxystyrene unit and 20 mol % of a styrene unit.

Synthesis Example 2

Synthesis of Copolymer (A2)

85 parts of p-hydroxystyrene, 18 parts of p-vinylbenzyl glycidyl ether, 21 parts of styrene and 4 parts of azobisisobutyronitrile were dissolved in 150 parts of propylene glycol dimethyl ether, to prepare a mixture liquid. This mixture liquid was heated at 70° C. for 10 hours. The mixture liquid after heating was introduced into a solution composed of toluene and hexane. A deposit precipitated was washed with hexane. A p-hydroxystyrene/p-vinylbenzyl glycidyl ether/styrene copolymer (A2) was thus obtained.

The copolymer (A2) had a weight average molecular weight (Mw) of 8,800. The copolymer (A2) was a copolymer containing 70 mol % of a p-hydroxystyrene unit, 10 mol % of p-vinylbenzyl glycidyl ether unit and 20 mol % of a styrene unit.

Synthesis Example 3

Synthesis of Copolymer (A3)

85 parts of p-hydroxystyrene, 19 parts of (3,4-epoxycyclohexyl)methylmethacrylate, 21 parts of styrene and 4 parts of azobisisobutyronitrile were dissolved in 150 parts of propylene glycol dimethyl ether, to prepare a mixture liquid. This mixture liquid was heated at 70° C. for 10 hours. The mixture liquid after heating was introduced into a solution composed of toluene and hexane. A deposit precipitated was washed with hexane. A p-hydroxystyrene/(3,4-epoxy cyclohexyl)methylmethacrylate/styrene copolymer (A3) was thus obtained.

The copolymer (A3) had a weight average molecular weight (Mw) of 8,900. The copolymer (A3) was a copolymer containing 70 mol % of a p-hydroxystyrene unit, 10 mol % of a (3,4-epoxycyclohexyl)methylmethacrylate unit and 20 mol % of a styrene unit.

Synthesis Example 4

Synthesis of Copolymer (A4)

85 parts of p-hydroxystyrene, 35 parts of (3,4-epoxy cyclohexyl)methylmethacrylate and 4 parts of azobisisobutyronitrile were dissolved in 150 parts of propylene glycol dimethyl ether, to prepare a mixture liquid. This mixture liquid was heated at 70° C. for 10 hours. The mixture liquid after heating was introduced into a solution composed of toluene and hexane. A deposit precipitated was washed with hexane. A p-hydroxystyrene/(3,4-epoxycyclohexyl)methylmethacrylate copolymer (A4) was thus obtained.

The copolymer (A4) had a weight average molecular weight (Mw) of 9,200. The copolymer (A4) was a copolymer containing 80 mol % of a p-hydroxystyrene unit and 20 mol % of a (3,4-epoxycyclohexyl)methylmethacrylate unit.

3. Preparation of Resin Composition or Photosensitive Composition

Example 1

100 parts of the copolymer (A1) of Synthesis Example 1 as the resin (A), 10 parts of 1,3-bis(2-oxazoline-2-yl)benzene as the crosslinking agent (B1), 5 parts of hexamethoxymethylmelamine as the crosslinking agent (B2), 25 parts of a condensate of 1,1-bis(4-hydroxyphenyl)-1-[4-[1-(4-hydroxyphenyl)-1-methylethyl]phenyl]ethane and 1,2-naphthoquinone diazide-5-sulfonic acid (molar ratio=1.0:2.0) as the photosensitive acid-generating agent (C), 180 parts of ethyl lactate as the solvent (E) were uniformly mixed with one another. Contaminants were removed with a membrane filter to prepare a photosensitive composition. The photosensitive composition obtained was used for its prescribed evaluations.

Examples 2 to 12 and Comparative Examples 1 to 5

The same operation was performed as in Example 1, except that in Example 1, the type and the amount of the incorporation components were changed as shown in Table 1, to prepare a resin composition or a photosensitive composition. The compositions obtained were used for their prescribed evaluations.

4. Evaluation

Evaluation methods of the resin compositions and photosensitive compositions are as follows.

4-1. Resolution

The photosensitive composition was applied by spin coating on a silicon wafer of 6 inches, and then heated with a hot plate at 110° C. for 5 minutes, to prepare a resin coating film having a uniform thickness of 20 μm. Then, using Aligner ("MA-150" manufactured by Suss Microtec), the resin coating film was irradiated with ultraviolet light from a high-pressure mercury light via a mask pattern in such a manner that the exposure quantity at a wavelength of 350 nm would be 8000 J/m$^2$. Then, the resin coating film was developed by being immersed in an aqueous tetramethylammonium hydroxide solution having a concentration of 2.38% by mass at 23° C. for 180 seconds. Then, the developed resin coating film was washed with ultrapure water for 60 seconds, and dried by air. Thereafter, the film was observed with a microscope (MHL110 manufactured by OLYMPUS Corporation). The dimension of the resolved minimum pattern was defined as the resolution. In the photosensitive composition of Examples 5 and 12, the resin coating film, after irradiated with ultraviolet ray, was heated at 100° C. for 3 minutes by using a hot plate.

4-2. Chemical Resistance

The resin composition or photosensitive composition was applied on a silicon wafer of 4 inches, and heated with a hot plate at 110° C. for 5 minutes, to prepare a resin coating film having a uniform thickness of 10 μm. Thereafter, the resin coating film was heated by using a convection type oven at 120° C. for 30 minutes, at 150° C. for 30 minutes, and further at 200° C. for 1 hour, to obtain a cured film. The cured film obtained was immersed in a dimethylsulfoxide solution at 40° C. for 10 minutes. Then, a swell percentage (%) of the cured film ((thickness after immersion−thickness before immersion)/thickness before immersion×100(%) was calculated.

4-3. Internal Stress

The resin composition or photosensitive composition was applied by spin coating on a silicon wafer of 4 inches, and then heated by using a hot plate at 110° C. for 5 minutes, to prepare a resin coating film having a uniform thickness of 10 μm. Then, the resin coating film was heated by using a convection type oven at 120° C. for 30 minutes, at 150° C. for 30 minutes and further at 200° C. for 1 hour, to obtain a cured film. The difference in the stress of the silicon wafer between before and after the formation of the cured film was measured with a stress measurement apparatus (FLX-2320-s manufactured by TOHO Technology Corporation).

TABLE 1

| | | Ex. 1 | Ex. 2 | Ex. 3 | Com. Ex. 1 | Com. Ex. 2 | Com. Ex. 3 | Com. Ex. 4 | Com. Ex. 5 | Ex. 4 | Ex. 5 | Ex. 6 | Ex. 7 | Ex. 8 | Ex. 9 | Ex. 10 | Ex. 11 | Ex. 12 |
|---|---|---|---|---|---|---|---|---|---|---|---|---|---|---|---|---|---|---|
| Resin composition or Photosensitive composition | | | | | | | | | | | | | | | | | | |
| Resin (A) having phenolic hydroxyl group | Copolymer (A1) of Synthesis Example 1 | 100 | 100 | 100 | 100 | 100 | 100 | 100 | 100 | | 100 | 100 | 100 | 100 | 50 | 60 | | |
| | Copolymer (A2) of Synthesis Example 2 | | | | | | | | 100 | | | | | | | | 100 | 100 |
| | Copolymer (A3) of Synthesis Example 3 | | | | | | | | | | | | | | 50 | | | |
| | Copolymer (A4) of Synthesis Example 4 | | | | | | | | | | | | | | | 40 | | |
| Crosslinking agent (B) | Crosslinking agent (B1) B1-1 | 10 | | 10 | | 15 | 5 | | | 10 | 10 | 10 | 5 | 15 | 10 | | 10 | 10 |
| | B1-2 | | 10 | | | | | | | | | | | | | 10 | | 10 |
| | Crosslinking agent (B2) B2-1 | 5 | 5 | 5 | 15 | 5 | | | | 5 | 5 | 5 | 5 | 5 | 5 | | | 5 |
| | B2-2 | | | | | | | | | | | | | | | 10 | | |
| | B2-3 | | | | | | | | | | | | | | | | 10 | |
| | Other crosslinking agent (B3) B3-1 | | | | | 10 | | 10 | 15 | | | | | | | | 5 | 5 |
| Photosensitive acid-generating agent (C) | C1-1 | 25 | 25 | 25 | 25 | 25 | 25 | 25 | 25 | 25 | | | 25 | 25 | 25 | 25 | 25 | |
| | C2-1 | | | | | | | | | | 2 | | | | | | | 3 |
| Adhesion assistant (D) | D-1 | | | | 5 | | | | | | 3 | | | | | 3 | | 3 |
| | D-2 | | | | | | | | | | | | | | 15 | | | |
| Solvent (E) | E-1 | 180 | 180 | 180 | 180 | 180 | 180 | 180 | 180 | 180 | 180 | 180 | 180 | 180 | 180 | 180 | 180 | 180 |
| Evaluation | | | | | | | | | | | | | | | | | | |
| Resolution (μm) | | 10 | 10 | 10 | 10 | 10 | 10 | 10 | 10 | 10 | 10 | — | 10 | 10 | 10 | 10 | 10 | 10 |
| Swell percentage (%) | | 1.2 | 1.5 | 1.2 | 1.1 | 8.4 | 9.5 | 11.2 | 10.5 | 0.8 | 1.3 | 1.2 | 2.4 | 0.8 | 1.0 | 0.7 | 1.1 | 1.8 |
| Internal stress (MPa) | | 20 | 20 | 20 | 25 | 22 | 20 | 19 | 22 | 18 | 20 | 20 | 18 | 21 | 18 | 20 | 20 | 20 |

Comparative Example 5 used, as the crosslinking agent (B), the other crosslinking agent (B3) alone, and thus gave a cured film with low chemical resistance. Comparative Example 1 used, as the crosslinking agent (B), the crosslinking agent (B2) having an active methylene group alone, which had high curability, and thus gave a cured film with excellent chemical resistance, but the internal stress of the substrate was large. Comparative Example 3 used, as the crosslinking agent (B), the oxazoline-based crosslinking agent (B1) alone, which had slightly lower curability, and thus the internal stress of the substrate was small, but the cured film had lower chemical resistance. Comparative Example 2 used both the crosslinking agent (B2) having an active methylene group and the other crosslinking agent (B3), but gave a cured film with lower chemical resistance. Comparative Example 4 used both the oxazoline-based crosslinking agent (B1) and the other crosslinking agent (B3), but gave a cured film with lower chemical resistance.

On the other hand, Inventive Examples used, as the crosslinking agent (B), both the oxazoline-based crosslinking agent (B1) and the crosslinking agent (B2) having an active methylene group, and thus gave cured films excellent in chemical resistance, and the internal stress of the substrate was small.

Details of the components indicated in Table 1 are as follows.

Crosslinking agent (B1-1): 1,3-bis(2-oxazoline-2-yl)benzene

Crosslinking agent (B1-2): 1,2,4-tris(2-oxazoline-2-yl)benzene ° Crosslinking agent (B2-1): hexamethoxymethylmelamine (compound described below)

Crosslinking agent (B2-2): compound described below

Crosslinking agent (B2-3): compound described below

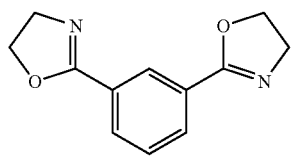
(B1-1)

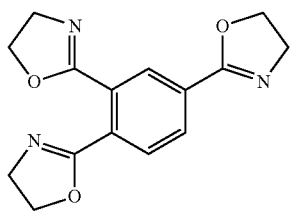
(B1-2)

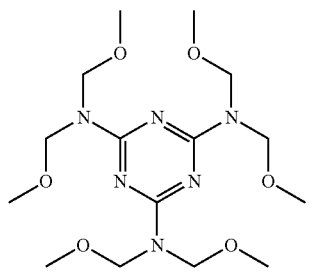
(B2-1)

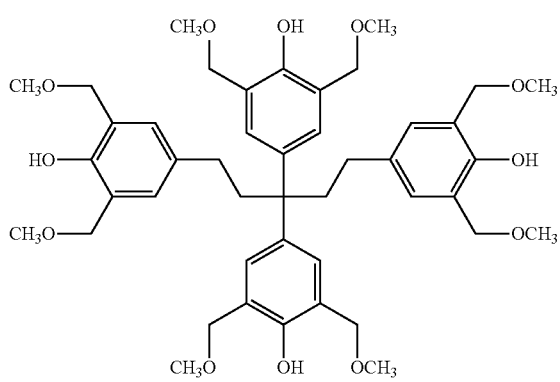
(B2-2)

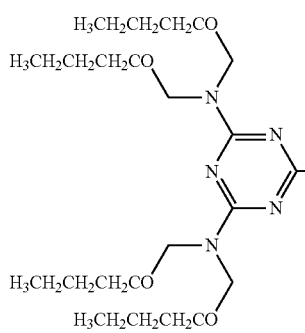
(B2-3)

Other crosslinking agent (B3-1): trimethylolpropane triglycidyl ether

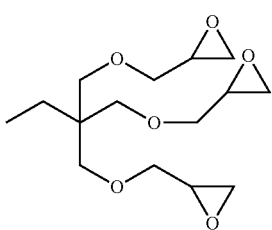 [SMILES: CCC(COCC1CO1)(COCC1CO1)COCC1CO1]

Quinone diazide compound (C1-1): condensate of 1,1-bis(4-hydroxyphenyl)-1-[4-[1-(4-hydroxyphenyl)-1-methylethyl]phenyl]ethane and 1,2-naphthoquinone diazide-5-sulfonic acid (molar ratio=1.0:2.0)

Other acid-generating agent (C2-1): 4,7-di-n-butoxynaphthyltetrahydrothiophenium trifluoromethanesulfonate Adhesion assistant (D-1): γ-glycidoxypropyltrimethoxysilane Adhesion assistant (D-2): 1,3,5-N-tris(trimethoxysilylpropyl)isocyanurate Solvent (E-1): ethyl lactate

What is claimed is:

1. A photosensitive composition comprising:
   a resin (A) having a phenolic hydroxyl group;
   a crosslinking agent (B1) having at least two oxazoline groups;

a crosslinking agent (B2) having at least two groups represented by —CH$_2$OR, wherein R is a hydrogen atom, an alkyl group having 1 to 10 carbon atoms or an acetyl group; and a photosensitive acid-generating agent (C), wherein a mass ratio of the crosslinking agent (B1) to the crosslinking agent (B2) (B1:B2) is in the range of 1.5:1 to 3:1, and wherein the crosslinking agent (B2) comprises at least one selected from a melamine-based crosslinking agent, a guanamine-based crosslinking agent, a phenol compound having a methylol group, a phenol compound having an alkylmethylol group and a phenol compound having an acetoxymethyl group.

2. The photosensitive composition according to claim 1, wherein the total of the contents of the crosslinking agent (B1) and of the crosslinking agent (B2) is 50 to 100% by mass based on 100% by mass of the whole of a crosslinking agen (B) contained in the composition.

3. The photosensitive composition according to claim 1, wherein the crosslinking agent (B1) has two to three oxazoline groups.

4. The photosensitive composition according to claim 1, wherein the photosensitive acid-generating agent (C) comprises a compound having a quinone diazide group.

5. A resin composition comprising:

a resin (A) having a phenolic hydroxyl group;

a crosslinking agent (B1) having at least two oxazoline groups; and a crosslinking agent (B2) having at least two groups represented by —CH$_2$OR, wherein R is a hydrogen atom, an alkyl group having 1 to 10 carbon atoms or an acetyl group, wherein a mass ratio of the crosslinking agent (B1) to the crosslinking agent (B2) (B1:B2) is in the range of 1.5:1 to 3:1, and wherein the crosslinking agent (B2) comprises at least one selected from a melamine-based crosslinking agent, a guanamine-based crosslinking agent, a phenol compound having a methylol group, a phenol compound having an alkylmethylol group and a phenol compound having an acetoxymethyl group.

6. A cured film obtained from the photosensitive composition according to claim 1.

7. A process for producing a patterned cured film comprising:

applying the photosensitive composition according to claim 1 on a support to form a resin coating film;

exposing the resin coating film;

developing the resin coating film by using an alkaline developing solution to form a pattern; and heat-curing the pattern to form a patterned cured film.

8. A cured film obtained from the resin composition according to claim 5.

9. A process for producing a cured film comprising:

applying the resin composition according to claim 5 on a support to form a resin coating film; and heat-curing the resin coating film to form a cured film.

10. An electronic part comprising the cured film according to claim 6.

11. An electronic part comprising the cured film according to claim 8.

12. The photosensitive composition according to claim 1, further comprising an adhesion assistant.

13. The resin composition according to claim 5, further comprising an adhesion assistant.

* * * * *